United States Patent
Tsutsumi et al.

(10) Patent No.: US 7,978,283 B2
(45) Date of Patent: Jul. 12, 2011

(54) SHIELDING STRUCTURE OF THIN TYPE MONITOR DEVICE

(75) Inventors: Takashi Tsutsumi, Osaka (JP); Shinji Morita, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 264 days.

(21) Appl. No.: 12/236,053

(22) Filed: Sep. 23, 2008

(65) Prior Publication Data
US 2009/0079903 A1 Mar. 26, 2009

(30) Foreign Application Priority Data
Sep. 26, 2007 (JP) ................................. 2007-248554

(51) Int. Cl.
G02F 1/1333 (2006.01)
H05K 5/04 (2006.01)
(52) U.S. Cl. ..................................... 349/59; 361/679.21
(58) Field of Classification Search .............. 349/58–60; 361/679.21, 679.22, 679.23, 679.24
See application file for complete search history.

(56) References Cited

U.S. PATENT DOCUMENTS

| | | | | |
|---|---|---|---|---|
| 7,456,807 B2 * | 11/2008 | Mizuno et al. | .................. | 345/60 |
| 2002/0171783 A1 * | 11/2002 | Yang | .................. | 349/58 |
| 2004/0246687 A1 | 12/2004 | Abe et al. | .................. | 361/752 |
| 2005/0185365 A1 * | 8/2005 | Yamaguchi et al. | .................. | 361/679 |
| 2006/0238669 A1 * | 10/2006 | Chiang | .................. | 349/58 |
| 2006/0268193 A1 * | 11/2006 | Wang et al. | .................. | 349/59 |
| 2007/0263135 A1 * | 11/2007 | Li | .................. | 349/58 |
| 2008/0151482 A1 * | 6/2008 | Wu et al. | .................. | 361/681 |

FOREIGN PATENT DOCUMENTS

| | | |
|---|---|---|
| JP | 10-233591 | 9/1998 |
| JP | 2000-068665 | 3/2000 |
| JP | 2007-214401 | 8/2007 |
| WO | WO 2004/107296 | 12/2004 |

* cited by examiner

Primary Examiner — Michelle R Connelly Cushwa
(74) Attorney, Agent, or Firm — Morgan, Lewis & Bockius LLP

(57) ABSTRACT

A shielding structure of thin type monitor device, includes: a monitor body; a first shielding box which is arranged in the monitor body, which is formed by cutting and bending a metal plate, which includes a flat plate portion having rectangular shape, and a terminal supporting portion which is formed by bending one end portion of the flat plate portion, into which a terminal is passed through, and which is fixed on a metal plate in the monitor body that is grounded; a terminal holder which includes a terminal hole which contacts with an opposite side of the terminal supporting portion with respect to the flat plate portion, through which the terminal is passed, and which forms a part of case of the monitor body; and a second shielding box which is formed by cutting and bending a metal plate, which includes a protecting portion that has a rectangular shape, that is arranged such that it contacts with the terminal supporting portion and that is made be parallel with the flat plate portion, and a standing portion which is formed by bending three sides in the protecting portion that do not contact with the terminal supporting portion and which is made contact with the flat plate portion.

6 Claims, 3 Drawing Sheets

SHIELDING STRUCTURE OF THIN TYPE MONITOR DEVICE

This application is based on Japanese Patent Application No. 2007-248554 filed on Sep. 26, 2007, the contents of which are hereby incorporated by reference.

BACKGROUND OF THE INVENTION

1. Field of the Invention

The present invention relates to shielding structure of an input output terminal portion of a thin type monitor device.

2. Description of Related Art

A connecting terminal to connect with an external device such as a DVD recorder, a game machine, and the like is provided with a thin type monitor device. The connecting terminal includes an input terminal to which a signal from the external device is input, and an output terminal from which a signal is output to the external device. Further, there is a case where a tuner terminal to receive a broadcast signal of television broadcast is also provided with the thin type monitor device.

In a conventional thin type monitor device, the signal which is dealt with between the thin type monitor device and the external device is an analog signal and low frequency signal is mainly used for it. Recently, because performance of the thin type monitor device and the external device become improved, a high frequency digital signal is going to be used between the thin type monitor device and the external device. Further, for the broadcast signal of digital terrestrial broadcasting and satellite broadcasting, digital signal is used. Because the high frequency digital signal is used, it is possible to deal with video signal or audio signal in high quality between the devices without deterioration.

On the other hand, with realization of high performance in the video devices, much noise referred to as electromagnetic interference (hereinafter referred to as "EMI") has come to output from electronic parts which are mounted on circuit board. This EMI is high frequency noise. The above described high frequency video signal and audio signal are apt to be affected by the EMI. And processed circuit boards which are arranged near the input terminal and/or the output terminal accordingly are covered by a metal box (hereinafter referred to as "shielding box"), the shielding box being grounded, and the influence of the EMI is consequently restrained (see, JP-A-H10-233591, JP-A-2000-068665, and the like).

However, by the conventional shielding box there is a case where not all the outer surfaces of the circuit boards in which influence of the EMI is desired to restrain, can be shielded. In such case, effect of the shielding box for restraining the influence of EMI becomes lower. Further, because the shielding box is grounded by screw fixing or a conducting tape, labor for fixing or a peculiar member is required. As a result, cost for the device becomes high just as much.

SUMMARY OF THE INVENTION

It is an object of the present invention to restrain influence of the EMI onto the circuit board which is covered by the shielding box by performing grounding of the shielding box certainly without increasing the peculiar member or assembling process.

An optical disc device according to one embodiment of the present invention includes: a monitor body; a first shielding box which is formed by cutting and bending a metal plate; a terminal holder which forms a part of case of the monitor body; and a second shielding box which is formed by cutting and bending a metal plate. The first shielding box includes: a flat plate portion having rectangular shape; and a terminal supporting portion which is formed by bending one end portion of the flat plate portion, into which a terminal is passed through, wherein a substrate on which the terminal is mounted is held to be parallel with the flat plate portion, a process circuit board that performs signal processing is fixed on a part of the flat plate portion near the terminal supporting portion, and the first shielding box is fixed on a metal plate in the monitor body that is grounded. The terminal holder includes a terminal hole contacting with an opposite side of the terminal supporting portion with respect to the flat plate portion, and through which the terminal is passed. The second shielding box includes: a protecting portion which has a rectangular shape and which is arranged such that it contacts with the terminal supporting portion and that is made be parallel with the flat plate portion; and a standing portion which is formed by bending three sides that do not contact with the terminal supporting portion in the protecting portion and which is made contact with the flat plate portion.

By this structure, the circumference of the process circuit board which is a circuit board that is affected by the EMI is covered by a metal plate, and the covering metal plate can be grounded. As a result, it is possible to restrain generation of adverse effect by the EMI.

In a preferred embodiment of the present invention, a through hole having rectangular shape may be formed on the terminal supporting portion, a fixing rib which is formed by bending a part of side in the protecting portion that is made contact with the terminal supporting portion may be formed on the second shielding box. The fixing rib may pass through the through hole in the terminal supporting portion and contact with a peripheral portion of the through hole, the fixing rib may be pressed down to the terminal holder, and the fixing rib may be consequently contacted with the terminal supporting portion.

In the preferred embodiment of the present invention, because the first shielding box and the second shielding box can be made stably contact with each other without using a screw or a conducting tape, it is possible to reduce steps for assembling.

In a preferred embodiment of the present invention, a pressing rib may be formed to press the fixing rib on a part of the terminal holder which contacts with the fixing rib, or the terminal holder may include an engaging depression on which the fixing rib is engaged, and the pressing rib may be formed inside of the engaging depression.

In a preferred embodiment of the present invention, a standup portion by cutting which is formed by bending an end portion of at least one of longer sides of the flat plate portion that is nearer to the terminal supporting portion, such that it is made be orthogonal to the terminal supporting portion may be formed in the first shielding box.

In a preferred embodiment of the present invention, the metal plate on which the first shielding box is fixed may be a rear frame of a liquid crystal module.

DESCRIPTION OF THE PREFERRED EMBODIMENTS

Figure 1:
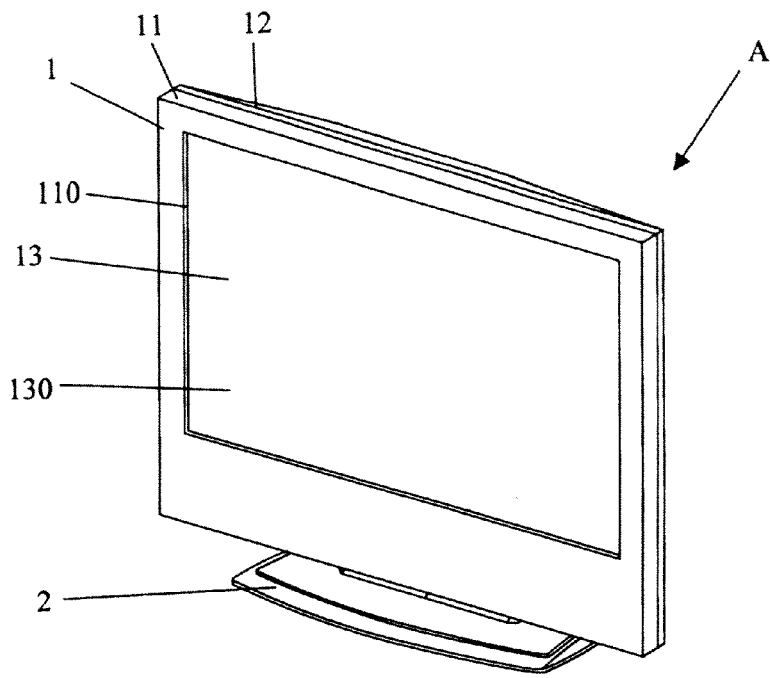
FIG. 1 is a perspective view to show a liquid crystal display device which is one example of a video device that is provided with a shielding structure in accordance with the present invention when viewed from front surface side.
Figure 2:
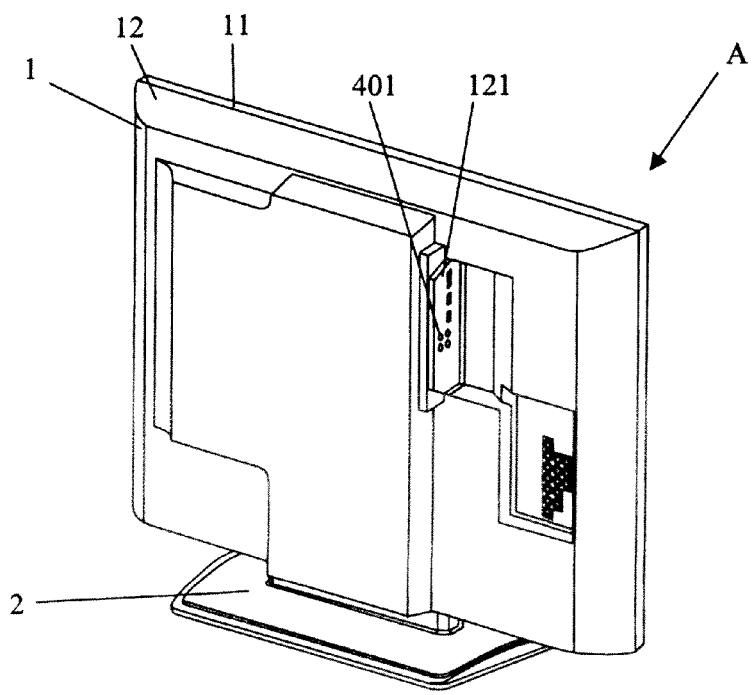
FIG. 2 is a perspective view of the liquid crystal display device shown in FIG. 1 when viewed from back surface side.

Hereinafter embodiment of the present invention will be explained with reference to drawings. FIG. 1 is a perspective view to show a liquid crystal display device which is one example of a video device that is provided with a shielding structure in accordance with the present invention when viewed from front surface side, and FIG. 2 is a perspective view of the liquid crystal display device shown in FIG. 1 when viewed from back surface side. As shown in FIG. 1 and FIG. 2, in the liquid crystal display device A at least a monitor body 1 and a stand 2 are provided. As shown in FIG. 1, the monitor body 1 is supported by the stand 2 in a state where it stands straight. At this point, in the below explanation, directions (leftward and rightward direction, upward and downward direction) of the liquid crystal display device A is based on a state where it is viewed in the stand straight state and from back surface side as far as another description is not given.

The monitor body 1 is provided with a front cabinet 11, a rear cabinet 12, and a liquid crystal module 13. The front cabinet 11 is an exterior packaging member which is a frame body of front side of the monitor body 1 having a rectangular shape. The front cabinet 11 is a member which is made by resin monolithic molding in this embodiment, however, it is not limited only to that. On the front cabinet 11, a window portion 110 which is a through hole having rectangular shape is formed in front surface side.

The rear cabinet 12 is an exterior packaging member in rear surface side of the monitor body 1 and it is fitted onto rear surface side of the front cabinet 11. The rear cabinet 12 is also formed by resin monolithic molding the same as the front cabinet 11. Inside of a space which is surrounded by the front cabinet 11 and the rear cabinet 12, the liquid crystal module 13 is arranged. The liquid crystal module 13 receives a signal from outside to display image on a display portion. The liquid crystal module 13 is arranged in the space surrounded by the front cabinet 11 and the rear cabinet 12 so that an effective display area 130 in the front surface side is exposed from the window portion 110 in the front cabinet 11.

In the rear surface of the rear cabinet 12, an output input portion 121 on which a terminal 401 to connect with the external device is arranged, is provided. On the output input portion 121, the input terminal and the output terminal are provided.

Figure 3:
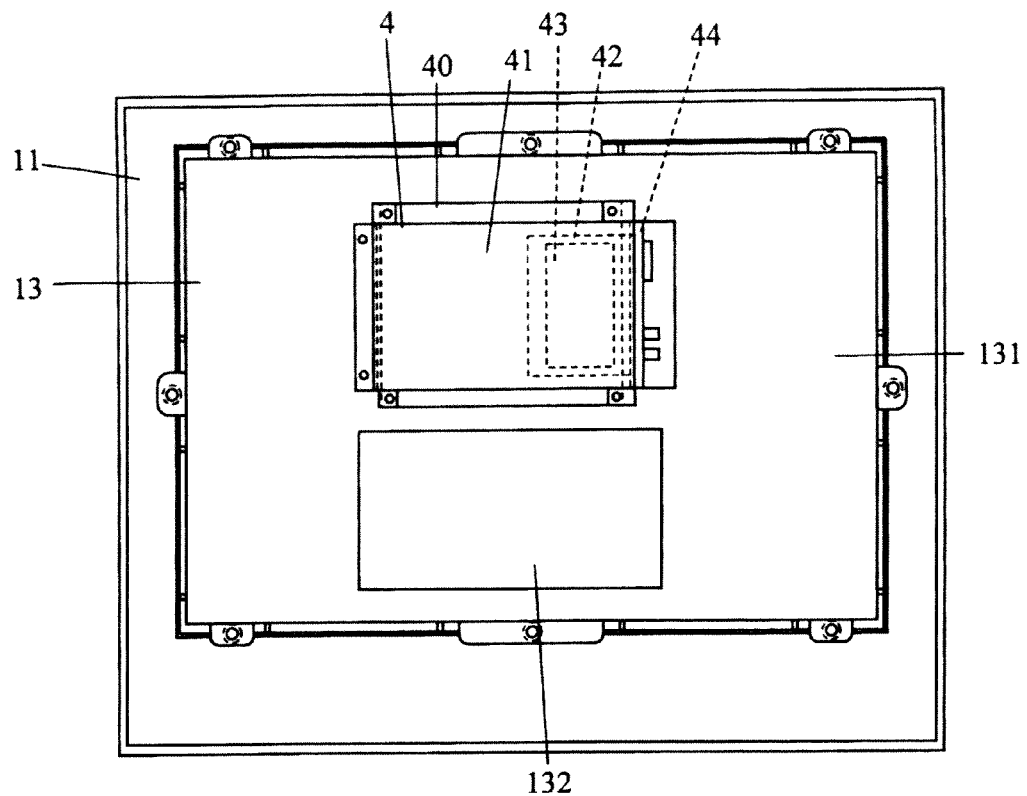
FIG. 3 is a rear view of the liquid crystal display device shown in FIG. 2 in a state where a rear cabinet is taken away.
Figure 4:
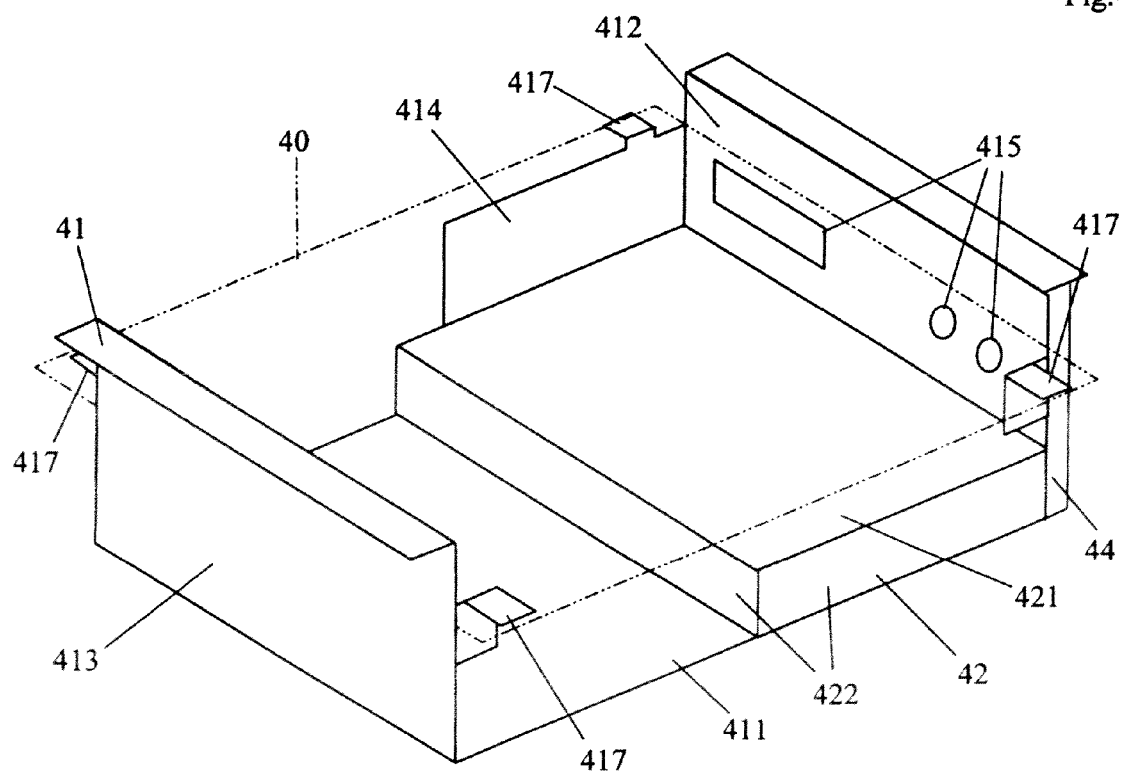
FIG. 4 is a perspective view of a terminal unit.
Figure 5:
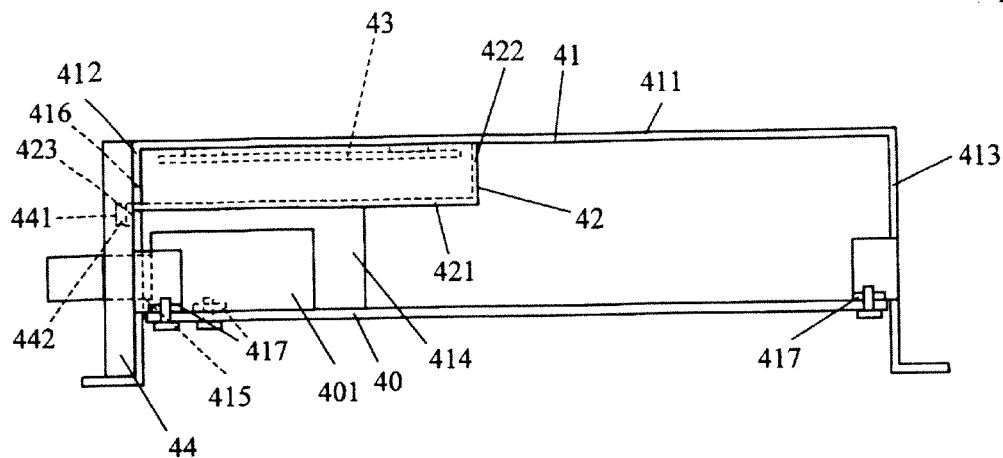
FIG. 5 is a side view of the terminal unit.
Figure 6:
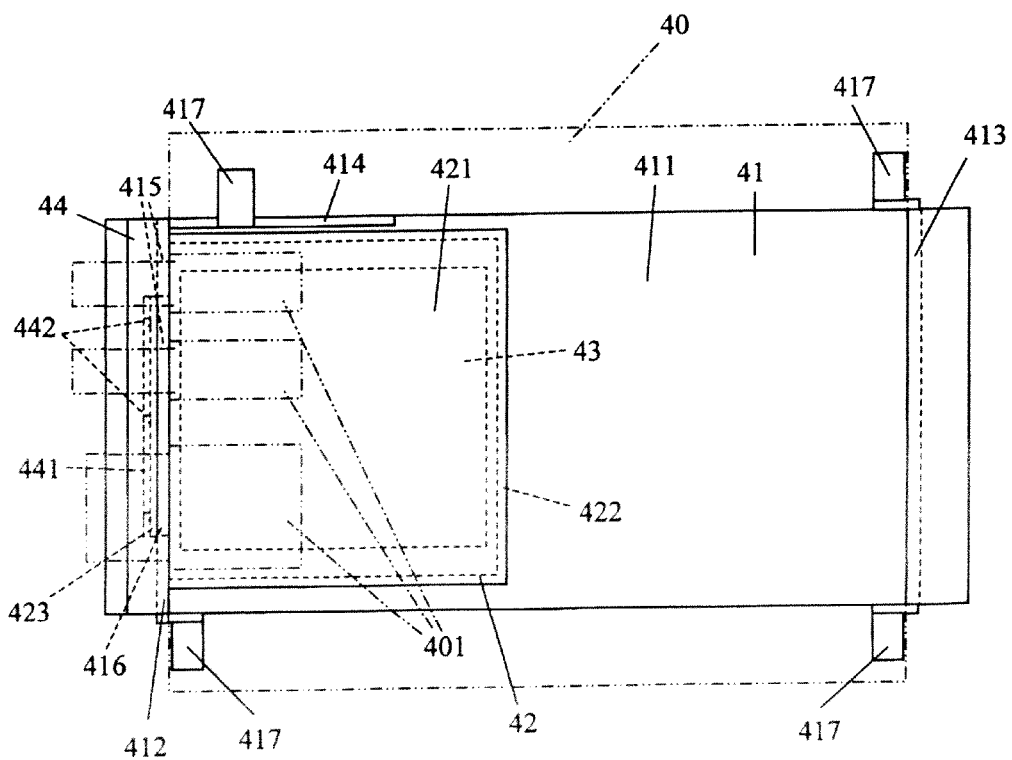
FIG. 6 is a bottom view of the terminal unit.

FIG. 3 is a rear view of the liquid crystal display device shown in FIG. 2 in a state where the rear cabinet is taken away, FIG. 4 is a perspective view of a terminal unit, FIG. 5 is a side view of the terminal unit, and FIG. 6 is a bottom view of the terminal unit. At this point in the terminal unit shown in FIG. 4, graphic representation of a process circuit board and a terminal holder is omitted. As shown in FIG. 3, the liquid crystal module 13 is attached on the rear surface side of the front cabinet 11. Optical parts such as a backlight, liquid crystal cell, and the like (all not shown) are arranged inside of a rear frame 131 in the liquid crystal module 13 which is formed in a bathtub shape by cutting and bending a metal plate. Further, on the rear surface of the rear frame 131, a main board 132 to control operation of the liquid crystal module 13 and the terminal unit 4 to connect with an external video device such as, for example, a DVD, a VCR, or the like are attached.

The terminal unit 4 is provided with at least a substrate 40, a first shielding box 41, a second shielding box 42, a process circuit board 43, and a terminal holder 44. On the substrate 40, a terminal 401 to connect with the external device is mounted in addition to the electronic parts. Further explanation will be given about the terminal unit. As shown in FIG. 4 and FIG. 5, the first shielding box 41 is formed by cutting and bending a metal plate and it has a flat plate portion 411 having a rectangular shape, a terminal supporting portion 412 which is formed by bending one of short sides of the flat plate portion 411 and into which the terminal 401 passes through, a supporting portion 413 which is formed by bending another short side of the flat plate portion 411 and a standup portion by cutting 414 which is formed by bending a part of one of longer sides of the flat plate portion 411 which is near the terminal supporting portion 412.

The process circuit board 43 is attached on a part of the flat plate portion 411 which is near the terminal supporting portion 412. The terminal supporting portion 412 is provided with a terminal hole 415 into which a tip portion of the terminal 401 that is mounted on the substrate 40 is inserted. Further, the terminal supporting portion 412 is also provided with an engaging hole 416 which engages with the second shielding box 42. The engaging hole 416 is a through hole which has a rectangular shape.

The second shielding box 42 is a member which is formed by cutting and bending a metal plate so as to be a box shape. The second shielding box 42 has a protecting plate 421 which has a rectangular shape, and on which a standing portion 422 is formed to stand by cutting and bending three sides except one side of the protecting plate 421 that has the rectangular shape. Further, in central part of the side of the protecting plate 421 on which the standing portion 422 is not formed, a fixing rib 423 which is formed by bending the protecting plate in an opposite side of the standing portion 422 and which is engaged with the engaging hole 416.

The process circuit board 43 is a substrate to deal with the signal which is input to and output from the terminal 401. The process circuit board 43 is a substrate to deal with a high frequency signal. The terminal holder 44 is arranged so that it contacts with the terminal supporting portion 412 of the first shielding box 41 and on which a through hole into that the terminal 401 is inserted, is formed. An engaging depression 441 to which the fixing rib 423 of the second shielding box 42 is engaged, is formed at a part on a surface of the terminal holder 44 which contacts with the terminal supporting portion 412, the part opposes to the engaging hole 416. Inside of the engaging depression 441 a pressing rib 442 is provided to press the fixing rib 423 which is engaged with the engaging depression 441.

Assembling of the terminal unit 4 is performed as described below. The process circuit board 43 is attached and fixed near part of the terminal supporting portion 412 of protecting plate 421 of the first shielding box 41. At this point the process circuit board 43 and the first shielding box 41 are kept in insulation state with each other. In this state, the second shielding box 42 is attached to them. The second shielding box 42 is arranged such that the fixing rib 423 is made engage with the engaging hole 416 of the terminal supporting portion 412, the standing portion 422 is made contact with the flat plate portion 411 of the first shielding box 41, and at the same time the protecting plate 421 is made be parallel with the process circuit board 43. At this time, misalignment of the second shielding box 42 is restrained because the fixing rib 423 is engaged with the engaging hole 416.

After the second shielding box 42 is attached onto the first shielding box 41, the substrate 40 on which the terminal 401 is mounted, is fixed inside of the first shielding box 41. The substrate 40 is fixed onto attaching ribs 417 by screwing, the attaching ribs 417 are formed by cutting and bending the terminal supporting portion 412, the standup portion by cutting 414, and the supporting portion 413. At this time, the terminal 401 penetrates the terminal hole 415 of the terminal supporting portion 412.

As above described, after the process circuit board 43, the second shielding box 42, and the substrate 40 are attached onto the first shielding box 41, tip portions of the terminal supporting portion 412 and the supporting portion 413 of the first shielding box 41 are fixed onto the rear frame 131 of the liquid crystal module 13. Then, the terminal holder 44 is made contact on the terminal supporting portion 412 from outside. By these operations, the fixing rib 423 is engaged inside of the engaging depression 441.

In this state, the rear cabinet 12 is fixed onto the front cabinet 11, and the terminal holder 44 is consequently pressed by the rear cabinet 12. By this operation, the fixing rib 423 is pressed down to the terminal supporting portion 412 by the pressing rib 442 which is formed inside of the engaging depression 441 in the terminal holder 44, then the fixing rib 423 and the terminal supporting portion 412 contact surely with each other.

By this arrangement, the first shielding box 41 and the second shielding box 42 can contact surely with each other, as a result, influence of the EMI on the process circuit board 43 can be restrained by grounding the first shielding box 41 and the second shielding box 42.

At this time, even in case where the terminal holder 44 strongly presses the terminal supporting portion 412, the terminal supporting portion 412 is pressed back by the terminal 401 which is mounted on the substrate 40. Further, because the standup portion by cutting 414 contacts vertically with the terminal supporting portion 412, bending of the terminal supporting portion 412 can be restrained.

At this point, the engaging depression 441 which engages with the fixing rib 423 is formed on the terminal holder 44, however, the present invention may be applied in a case where the engaging depression 441 is not formed. In such case, the pressing rib 442 may not be formed. The terminal holder 44 can make the fixing rib 423 surely contact with the terminal supporting portion 412 even though the pressing rib 442 is not formed. By this arrangement because the second shielding box 42 can be grounded surely, it is possible to restrain the influence of EMI.

Further, the pressing rib 442 may be formed such that it protrudes from surface of the terminal holder 44. In such case, even when the space between the terminal supporting portion 412 and the terminal holder 44 becomes wider than the prescription, the fixing rib 423 can be surely contacted with the terminal supporting portion 412, because the terminal holder 44 on which the engaging depression 441 is not formed is used.

As above described, because the first shielding box and the second shielding box can be contacted without using the screw, the screw can be omitted. As a result, it becomes possible to cut out labor for screwing for fixing.

As above described, the embodiment of present invention has been explained concretely, however, the present invention is not limited to the above described embodiment and various modification can be introduced to the present invention without departing spirit and scope of the invention.

The present invention can be applied to the shielding structure of liquid crystal display device, the plasma display device, and the like.

What is claimed is:

1. A shielding structure of thin type monitor device comprising:
   a monitor body having a first metal plate that is grounded;
   a first shielding box, which is formed by cutting and bending a second metal plate arranged inside of the monitor body, and fixed on the first metal plate in the monitor body;
   a terminal holder, arranged to contact the first shielding box, and formed as a part of a case of the monitor body; and
   a second shielding box, which is formed by cutting and bending a third metal plate, wherein
   the first shielding box includes:
      a flat plate portion having rectangular shape; and
      a terminal supporting portion which is formed by bending one short side of the flat plate portion such that a terminal can pass through, in which a substrate on which the terminal is mounted is held to be parallel with the flat plate portion, and a process circuit board performing signal processing is fixed on a part close to the terminal supporting portion in the flat plate portion;
   the terminal holder includes:
      a terminal hole contacting an opposite side of the terminal supporting portion with respect to the flat plate portion, and configured for the terminal to pass through;
   the second shielding box includes:
      a protecting portion which has a rectangular shape and is arranged such that it contacts the terminal supporting portion and is parallel to the flat plate portion; and
      a standing portion which is formed by bending three sides of the protecting portion that do not contact the terminal supporting portion, and is configured to contact the flat plate portion;
   a through hole having a rectangular shape formed on the terminal supporting portion;
   a fixing rib formed by bending a part of a side in the protecting portion that contacts the terminal supporting portion, is formed on the second shielding box;
   the fixing rib passes through the through hole in the terminal supporting portion and contacts a peripheral portion of the through hole, wherein the fixing rib is pressed down by the terminal holder, and the fixing rib is consequently contacted the terminal supporting portion; and
   a pressing rib formed to press the fixing rib on a part of the terminal holder which contacts the fixing rib.

2. The shielding structure of thin type monitor device according to claim 1, wherein the terminal holder includes an engaging depression on which the fixing rib is engaged, and the pressing rib is formed inside of the engaging depression.

3. The shielding structure of thin type monitor device according to claim 2, wherein a standup portion is formed in the first shielding box, wherein the standup portion is formed by bending an end portion of at least one of the long sides of the flat plate portion that is closer to the terminal supporting portion such that the standup portion is orthogonal to the terminal supporting portion.

4. The shielding structure of thin type monitor device according to claim 2, wherein the first metal plate on which the first shielding box is fixed, is a rear frame of a liquid crystal module.

5. The shielding structure of thin type monitor device according to claim 1, wherein a standup portion is formed in the first shielding box, wherein the standup portion is formed by bending an end portion of at least one of the long sides of the flat plate portion that is closer to the terminal supporting portion such that the standup portion is orthogonal to the terminal supporting portion.

6. The shielding structure of thin type monitor device according to claim 1, wherein the first metal plate on which the first shielding box is fixed, is a rear frame of a liquid crystal module.

* * * * *